US010631431B2

(12) United States Patent
Chen et al.

(10) Patent No.: US 10,631,431 B2
(45) Date of Patent: Apr. 21, 2020

(54) LOW DOWN SEISMIC SHOCK RACK DESIGN

(71) Applicant: QUANTA COMPUTER INC., Taoyuan (TW)

(72) Inventors: Chao-Jung Chen, Taoyuan (TW); Chih-Ming Chen, Taoyuan (TW); Ta-Chih Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 136 days.

(21) Appl. No.: 15/914,134

(22) Filed: Mar. 7, 2018

(65) Prior Publication Data

US 2019/0183248 A1    Jun. 20, 2019

Related U.S. Application Data

(60) Provisional application No. 62/607,162, filed on Dec. 18, 2017.

(51) Int. Cl.
*H05K 7/14* (2006.01)
*A47B 97/00* (2006.01)
(Continued)

(52) U.S. Cl.
CPC ......... *H05K 7/1495* (2013.01); *A47B 91/005* (2013.01); *A47B 91/02* (2013.01);
(Continued)

(58) Field of Classification Search
CPC ....... A47B 97/00; A47B 91/005; A47B 91/02; A47B 2097/008; F16F 13/002;
(Continued)

(56) References Cited

U.S. PATENT DOCUMENTS 4,371,143 A * 2/1983 Ishida ................... F16M 1/00
 248/562
4,596,373 A * 6/1986 Omi ..................... F16F 15/02
 248/421
(Continued)

FOREIGN PATENT DOCUMENTS

CN 206061337 U 3/2017
DE 102017201598 A1 * 8/2018 ......... G03F 7/70766
(Continued)

OTHER PUBLICATIONS

TW Office Action for Application No. 107127677, dated May 14, 2019, w/ First Office Action Summary.
(Continued)

*Primary Examiner* — Eret C McNichols
(74) *Attorney, Agent, or Firm* — Nixon Peabody LLP; Zhou Lu

(57) ABSTRACT

A shock absorber apparatus is provided that includes an upper rack frame, a middle plate, and a lower rack frame. The upper rack frame is configured to secure a bottom frame of a rack server. The upper rack frame includes a first set of rail assemblies. The middle plate includes a second set of rail assemblies and a first set of carriers corresponding with the first set of rail assemblies of the upper rack frame. The first set of rail assemblies is configured to restrict movement of the first plurality of carriers to a first axis. The lower rack frame includes a second set of carriers corresponding with the second set of rail assemblies of the middle plate. The second set of rail assemblies is configured to restrict movement of the second plurality of carriers to a second axis.

14 Claims, 8 Drawing Sheets

(51) Int. Cl.
*A47B 91/02* (2006.01)
*F16F 13/00* (2006.01)
*A47B 91/00* (2006.01)
*F16F 15/02* (2006.01)

(52) U.S. Cl.
CPC ............ *A47B 97/00* (2013.01); *F16F 13/002* (2013.01); *F16F 15/02* (2013.01); *F16F 15/022* (2013.01); *H05K 7/1489* (2013.01); *A47B 2097/008* (2013.01); *F16F 2224/025* (2013.01); *F16F 2230/0023* (2013.01)

(58) Field of Classification Search
CPC ......... F16F 2224/025; F16F 2230/0023; F16F 15/022; F16F 15/02; H05K 7/1489; H05K 7/1495
USPC ................. 248/346.03, 346.04, 346.06, 562
See application file for complete search history.

(56) References Cited

U.S. PATENT DOCUMENTS

| | | | | |
|---|---|---|---|---|
| 5,816,559 | A * | 10/1998 | Fujimoto | E04H 9/021 248/636 |
| 5,913,503 | A | 6/1999 | Satoh et al. | |
| 6,092,780 | A * | 7/2000 | Kurabayashi | E04H 9/021 248/562 |
| 6,123,313 | A * | 9/2000 | Otsuka | E04H 9/023 248/580 |
| 6,364,274 | B1 | 4/2002 | Omi et al. | |
| 9,732,516 | B2 * | 8/2017 | Zohar | G01V 1/008 |
| 10,495,176 | B2 * | 12/2019 | Lu | F16F 7/116 |
| 2004/0262487 | A1 | 12/2004 | Kawashima et al. | |
| 2005/0100253 | A1 | 5/2005 | Chang et al. | |
| 2018/0058086 | A1* | 3/2018 | Hubbard | F24F 7/10 |
| 2019/0159358 | A1* | 5/2019 | Chen | H05K 7/1495 |

FOREIGN PATENT DOCUMENTS

| | | |
|---|---|---|
| JP | S58-124843 A | 7/1983 |
| JP | H10-281217 A | 10/1998 |
| JP | 2004138099 A | 5/2004 |
| JP | 2011163447 A | 8/2011 |
| JP | 2015153416 A | 8/2015 |
| TW | 200736473 A | 10/2007 |

OTHER PUBLICATIONS

TW Search Report for Application No. 107127677, dated May 14, 2019, w/ First Office Action.

Extended European Search Report for Application No. EP18197962.6, dated Apr. 5, 2019, w/Action Summary.

JP Office Action for Application No. 2018-227374, dated Oct. 18, 2019, w/ First Office Action Summary.

* cited by examiner

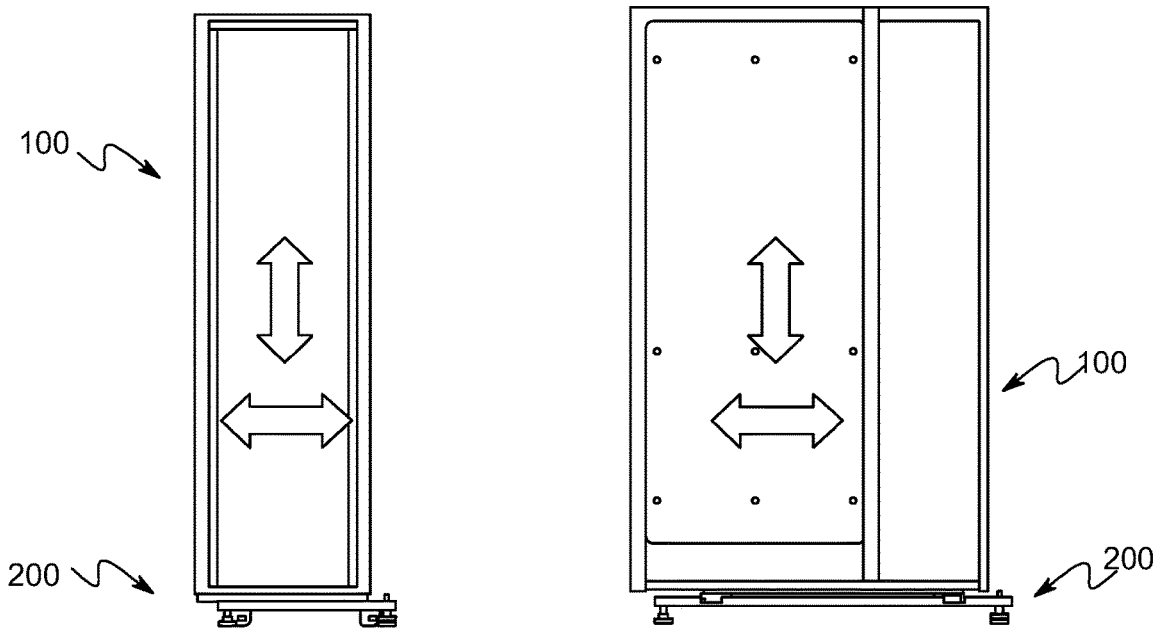
FIG. 6
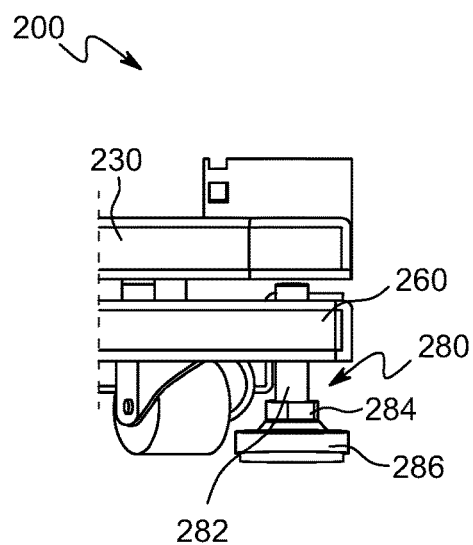 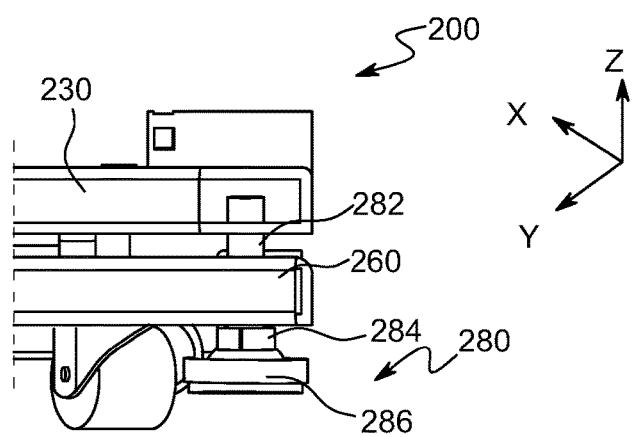
FIG. 7A  FIG. 7B

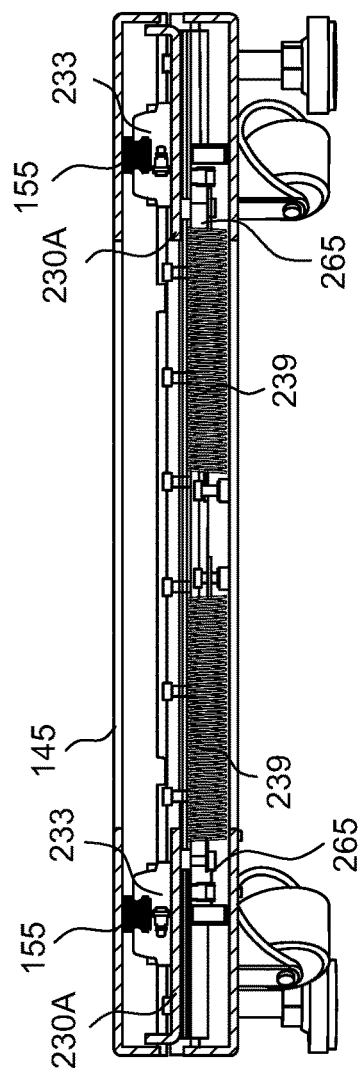
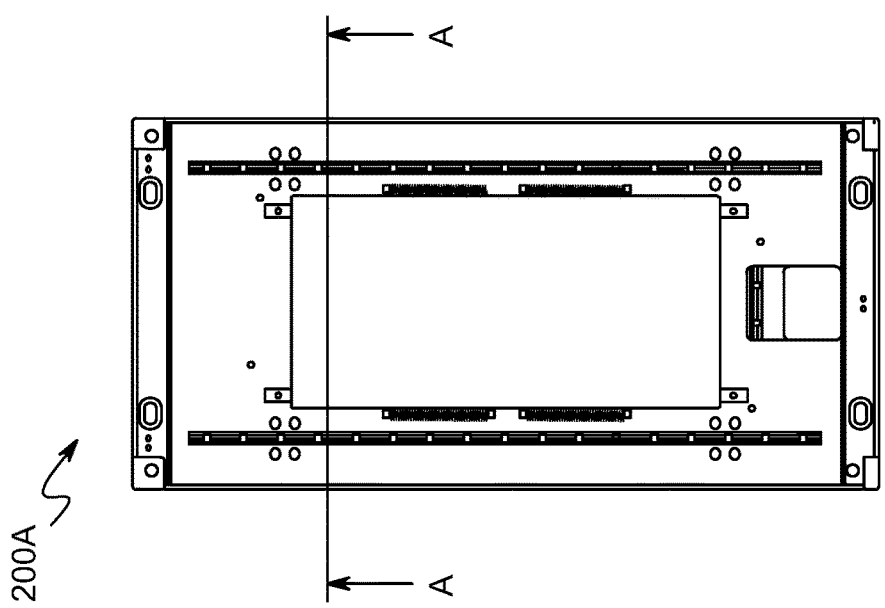
FIG. 8

LOW DOWN SEISMIC SHOCK RACK DESIGN

CROSS REFERENCE TO RELATED APPLICATIONS

This application claims priority to U.S. Provisional Application No. 62/607,162 entitled "LOW DOWN SEISMIC SHOCK RACK DESIGN", filed on Dec. 18, 2017, the contents of which are incorporated by reference in its entirety.

FIELD OF THE INVENTION

The disclosure relates generally to rack systems for servers and electronic components, and more particularly to apparatus and methods for minimizing damage during earthquake or seismic shock activity.

BACKGROUND

It is desirable to protect electronic equipment from damage during earthquake or seismic shock activity. It is particularly essential that after an earthquake or seismic shock, telecommunications equipment located in the earthquake vicinity is operational. In some data centers, frames are bolted down to the floor to limit the effects of strong earthquakes or seismic shock activity on the electronic components. Bolting rack systems to the floor tends to reduce the risk of the rack system tipping over. Bolting rack systems to the floor may not, however, protect computing devices in the racks from damage caused by shaking in the portions of the rack above the floor under seismic loads.

As a result, electronic components have been mounted in specially designed frames which are intended to support the equipment so as to withstand the most severe earthquakes and seismic shocks that are likely to occur in a given vicinity. It is known that an earthquake resistant frame should have as high a natural vibrational frequency as possible, and to make such frames rigid for this purpose. Typically, earthquake resistant frames are made of massive section structures with large section bracing and stiffening members. These earthquake resistant frames are extremely heavy and expensive to manufacture.

Conventional frames have typically been implemented with underlying supporting structures. However, the conventional frames are not implemented in accordance with their specific design. For example, a conventional frame when mounted securely upon a concrete floor, has a natural vibrational frequency of approximately 6.5 Hz when subjected to an earthquake measured with an intensity of about 8.3 on the Richter scale. This frequency is acceptable to prevent damage to telecommunications equipment held by the frame. However, telecommunications equipment is often housed in upper stories of buildings, e.g. the second or third story. The horizontal acceleration levels in movements of floors during seismic activity increase from floor-to-floor upwardly from the ground. When conventional frames are mounted upon an above ground floor, the acceleration levels of movement of the floor effectively acts upon the frame so that it is less likely to protect electronic equipment from strong earthquakes or seismic activity. Therefore, the conventional frames are not effective.

The present invention provides an earthquake resistant, electronic equipment frame that can minimize the above problems.

SUMMARY

The present disclosure provides a shock absorber apparatus. The shock absorber apparatus includes an upper rack frame, a middle plate, and a lower rack frame. The upper rack frame is configured to secure a bottom frame of a rack server. The upper rack frame includes a first set of rail assemblies. The middle plate includes a second set of rail assemblies, and a first set of carriers corresponding with the first set of rail assemblies of the upper rack frame. The first set of rail assemblies is configured to restrict movement of the first plurality of carriers to a first axis. The lower rack frame includes a second set of carriers corresponding with the second set of rail assemblies of the middle plate. The second set of rail assemblies is configured to restrict movement of the second plurality of carriers to a second axis.

In one aspect of the present disclosure, the middle plate includes a first set of spring modules for the first axis and a second set of spring modules for the second axis. In some embodiments of the disclosure, the lower rack frame includes a set of dampers preventing movement of the rack server in a third axis. In some alternative embodiments of the disclosure, the middle plate includes a first set of air cushion modules for the first axis and a second set of air cushion modules for the second axis. In some embodiments, the shock absorber apparatus also includes a levering feet device configured to secure the shock absorber apparatus to a floor surface. The levering feet device is described in detail below with respect to FIGS. 7A and 7B. In some embodiments of the disclosure, the levering feet device includes a contact feature. The contact feature includes an outer surface material such that, when in contact with the floor surface, prevents movement of the shock absorber apparatus and subsequently the rack server. In some embodiments of the disclosure, the levering feet device is retractable from the lower rack frame of the shock absorber apparatus.

The present disclosure also provides a rack server. The rack server includes a top frame and a bottom frame, connected by at least one vertical post. The rack server also includes a shock absorber apparatus located at the bottom frame. The shock absorber apparatus includes an upper rack frame, a middle plate, and a lower rack frame. The upper rack frame is configured to secure the bottom frame of the rack server. The upper rack frame includes a first set of rail assemblies. The middle plate includes a second set of rail assemblies and a first set of carriers corresponding with the first set of rail assemblies of the upper rack frame. The first set of rail assemblies is configured to restrict movement of the first plurality of carriers to a first axis. The lower rack frame includes a second set of carriers corresponding with the second set of rail assemblies of the middle plate. The second set of rail assemblies is configured to restrict movement of the second plurality of carriers to a second axis.

Although many of the examples are described herein with reference to enclosing a solid state drive (SSD) device, it should be understood that these are only examples, and the present disclosure is not limited in this regard. Rather, any electronic component installed within a computer data center can be implemented within the disclosed enclosure.

Additional features and advantages of the disclosure will be set forth in the description that follows, and in part, will be obvious from the description, or can be learned by practice of the principles disclosed herein. The features and advantages of the disclosure can be realized and obtained by means of the instruments and combinations particularly pointed out in the appended claims. These and other features of the disclosure will become fully apparent from the following description and appended claims, or can be learned by the practice of the principles set forth herein.

BRIEF DESCRIPTION OF THE DRAWINGS

In order to describe the manner in which the above-recited and other advantages and features of the disclosure can be obtained, a more particular description of the principles described above will be rendered by reference to specific examples illustrated in the appended drawings. These drawings depict only example aspects of the disclosure, and are therefore not to be considered as limiting of its scope The principles are described and explained with additional specificity and detail through the use of the following drawings.

FIG. 6 illustrates the relative displacement of the rack 100 with respect to the shock absorber apparatus 200.

FIG. 7A illustrates a levering feet device in a first position installed on the shock absorber apparatus 200 of FIG. 2.

FIG. 7B illustrates a levering feet device in a second position installed on the shock absorber apparatus 200 of FIG. 2.

FIG. 8 illustrates a cross-section along section A-A of the shock absorber apparatus 200A of FIG. 3A.

DETAILED DESCRIPTION

Figure 1:
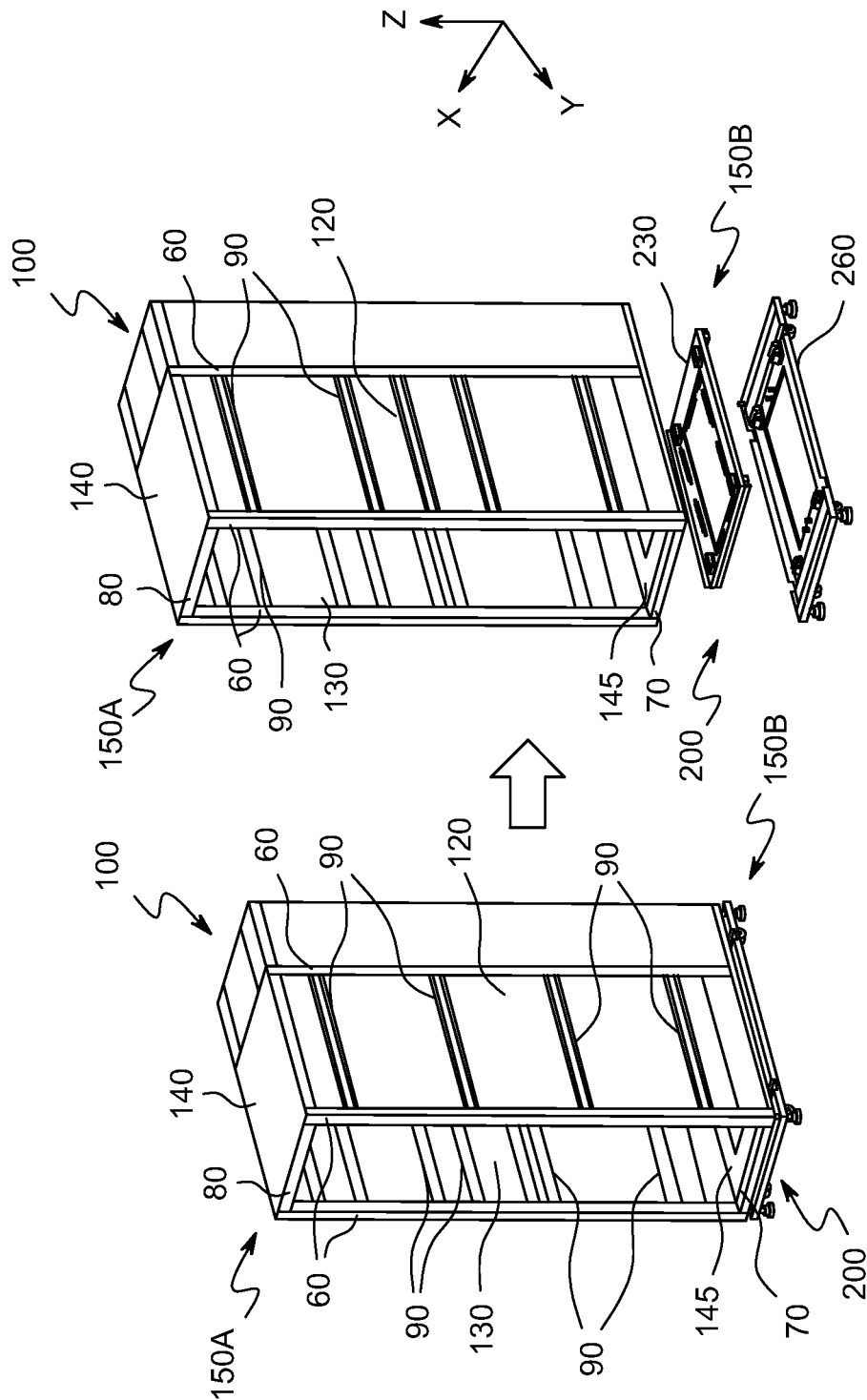
FIG. 1A illustrates a perspective view of a rack 100, installed on a shock absorber apparatus 200, in accordance with an implementation of the present disclosure.
FIG. 1B illustrates a perspective view of the rack 100, and an exploded view of the shock absorber apparatus 200, in accordance with an implementation of the present disclosure.

The present invention is described with reference to the attached figures, wherein like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As discussed above, there is significant interest in providing an earthquake resistant electronic equipment frame. In particular, there is significant interest in developing mechanisms that: (1) will account for the acceleration levels of movement of the above ground floor which effectively acts upon the frame; and (2) dissipate vibration in all operating frequency ranges. Some embodiments of the present application disclose air cushions and rubber dampers to provide stiffness and damping to counter the vibration force and frequency. In alternative or additional embodiments, the present application discloses springs and rubber dampers to provide stiffness and damping to counter the vibration force and frequency. While not explicitly shown in the embodiments, it is contemplated within the scope of the embodiment of the present disclosure that air cushions and springs may be incorporated as additional vibration dissipation means, complimentary vibration dissipation means or alternatively as an exclusive means.

FIG. 1A illustrates a perspective view of a rack 100 of an exemplary embodiment. The rack 100 may be one of a multitude of racks installed in a data center. The rack 100 includes front-to-back beams 90, top side-to-side beams 80, bottom side-to-side beams 70, vertical posts 60, top plate 140, base 145, left wall 120, and right wall 130. The front-to-back beams 90 and the top side-to-side beams 80 are connected to form a top frame 150A. Similarly, the front-to-back beams 90 and the bottom side-to-side beams 70 are connected to form a bottom frame 150B. In some embodiments, the front-to-back beams 90 are permanently connected to the bottom and top side-to-side beams 70, 80. For example, the front-to-back beams 90 are connected to the bottom and top side-to-side beams 70, 80 using permanent connectors such as rivets and welds. In alternative embodiments, the front-to-back beams 90 are removably connected to the bottom and top side-to-side beams 70, 80. For example, the front-to-back beams 90 are connected to the bottom and top side-to-side beams 70, 80 using removable connectors or fasteners, such as nuts and bolts, screws, or the like. A shock absorber apparatus 200 can be attached to the rack 100 at the bottom frame 150B. This is discussed in greater detail with respect to FIG. 1B.

The vertical posts 60 are connected to the top and bottom frames 150A, 150B to form the rack 100. Specifically, the vertical posts 60 are connected to the bottom and top side-to-side beams 70, 80. In some embodiments, the vertical posts 60 are removably connected to the bottom and top side-to-side beams 70, 80. For example, the vertical posts 60 are connected to the bottom and top side-to-side beams 70, 80 using removable connectors, such as nuts and bolts and screws. In alternative embodiments, the vertical posts 60 are permanently connected to the bottom and top side-to-side beams 70, 80. For example, the vertical posts 60 are permanently connected to the bottom and top side-to-side beams 70, 80 using permanent connectors, such as rivets and welds.

In some embodiments, the left and right walls 120, 130 are removably connected to the front-to-back beams 90 and vertical posts 60. For example, the left and right walls 120, 130 are connected to the front-to-back beams 90 and vertical posts 60 using removable connectors, such as nuts and bolts and screws. In alternative embodiments, the left and right walls 120, 130 are permanently connected to front-to-back beams 90 and vertical posts 60. For example, the left and right walls 120, 130 are connected to front-to-back beams 90 and vertical posts 60 using permanent connectors, such as rivets and welds. The left and right walls 120, 130 provide additional stiffness to the rack 100, and more particularly, to the front-to-back beams 90 and vertical posts 60.

FIG. 1B illustrates a perspective view of the rack 100, and an exploded view of the shock absorber apparatus 200, in accordance with an implementation of the present disclosure. The base 145 is connected to the vertical posts 60 of the rack 100. In some embodiments, the base 145 is removably connected to the vertical posts 60. For example, the base 145 is connected to the vertical posts 60 using removable connectors, such as nuts and bolts and screws. In alternative embodiments, the base 145 is permanently connected to the vertical posts 60. For example, the base 145 is connected to the vertical posts 60 using permanent connectors, such as rivets and welds. The base 145 is also removably connected to the shock absorber apparatus 200. The shock absorber apparatus 200 includes a middle plate 230 and a lower rack frame 260. The connection between the base 145, middle plate 230, and lower rack frame 260 is discussed in greater detail below with respect to FIG. 2. In some embodiments, the base 145 can be a member of the shock absorber apparatus as an upper rack frame.

Figure 2:
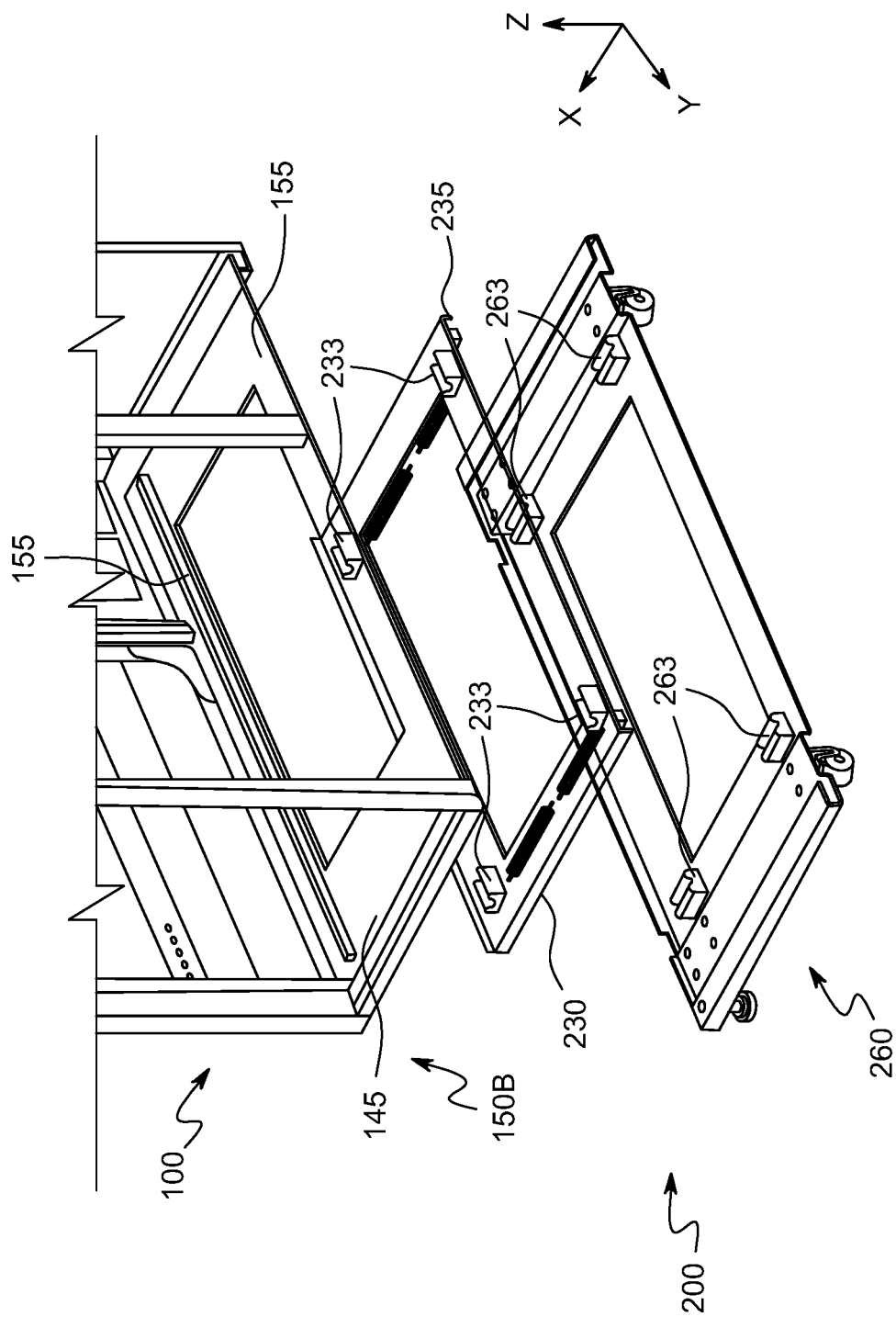
FIG. 2 illustrates the shock absorber apparatus 200, in accordance with an implementation of the present disclosure.

FIG. 2 illustrates the shock absorber apparatus 200, in accordance with an implementation of the present disclosure. The base 145 of the rack 100 can include rail assemblies 155 for y-axis movement. The middle plate 230 of the shock absorber apparatus 200 can include carriers 233 for y-axis movement and rail assemblies 235 for x axis movement. The lower rack frame 260 can include carriers for x-axis movement 263. The rail assemblies 155 of the base 145 can be implemented to restrict movement of a corresponding apparatus to just the y-axis. Similarly, the rail assemblies 235 of the middle plate 230 can be implemented to restrict movement of a corresponding apparatus to just the x-axis.

In this case, the rail assemblies 155 of the base 145 are configured to receive the carriers 233 of the middle plate 230. The rail assemblies 155 restrict the movement of the carriers 233 to the y-axis. The rail assemblies 235 of the middle plate 230 are configured to receive the carriers 263 of the lower rack frame 260. The rail assemblies 235 restrict the movement of the carriers 263 to the x-axis. The respective rail assemblies and corresponding carriers enable the rack 100 to have relative displacement with the shock absorber apparatus 200 in the x and y axis. Moreover, the respective rail assemblies and corresponding carriers restrict movement in the z-axis. These linear guides coupled restrict the rack 100 to specific movement with respect to the shock absorber apparatus 200.

In some embodiments of the disclosure, the base 145, middle plate 230 and lower rack frame 260 can include spring and damper modules to provide stiffness and damping to counter vibration force and frequency. In alternative embodiments, the base 145, middle plate 230, and lower rack frame 260 can include spring and damper modules to provide stiffness and damping to counter vibration force and frequency. The linear guides coupled with spring and damper modules, or air cushion and damper modules, enable the shock absorber apparatus 200 to absorb much of the seismic energy associated with an earthquake or other seismic activity. This is discussed below in greater detail with respect to FIGS. 4 and 5.

Figure 3A:
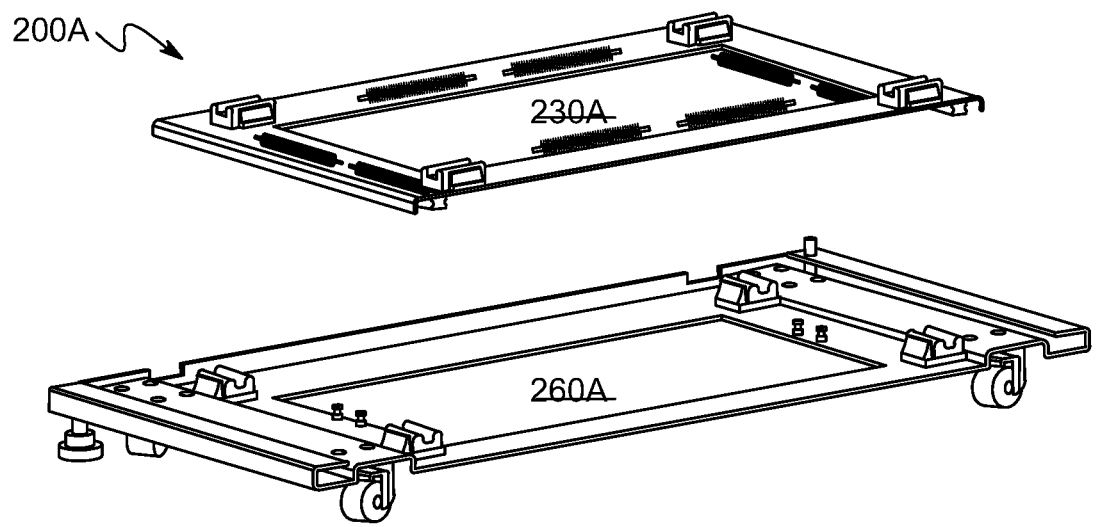
FIG. 3A illustrates the shock absorber apparatus 200A implementing springs and rubber damper, in accordance with a first embodiment of the disclosure.
Figure 3B:
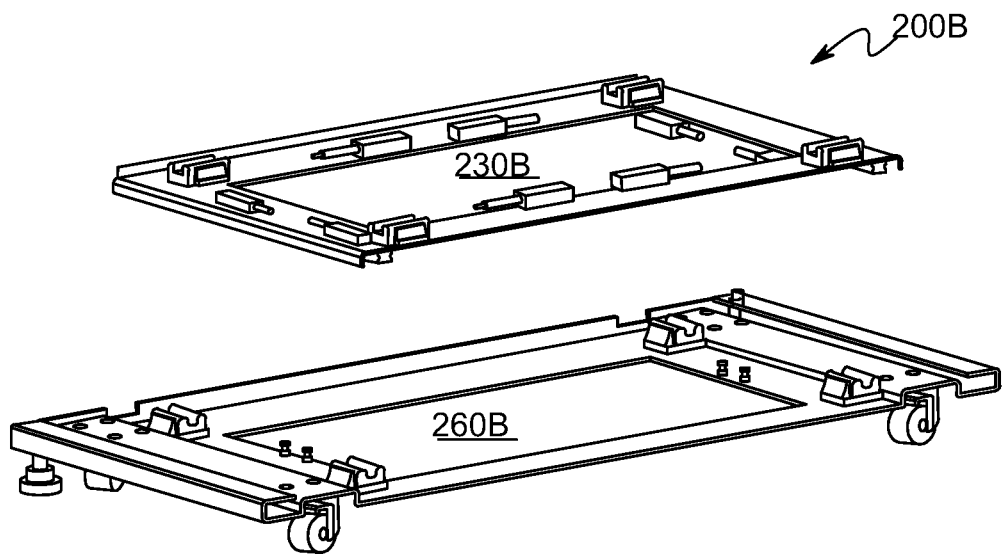
FIG. 3B illustrates the shock absorber apparatus 200B implementing cushions and rubber damper, in accordance with a second embodiment of the disclosure.

FIG. 3A illustrates the shock absorber apparatus 200A implementing springs and rubber damper, according to a first embodiment. Conversely, FIG. 3B illustrates the shock absorber apparatus 200B implementing cushions and rubber damper, according to a second embodiment. The base 145 includes the y-axis rail; the middle plate 230 includes y-axis carriers and x-axis rails; and the lower rack frame includes x-axis carriers and rubber dampers for Z axis (discussed below with respect to FIGS. 4 and 5). In FIG. 3A, spring and damper modules are assembled between the base (not shown), middle plate 230A and the lower rack frame 260A. Coupled with the linear guides configuration described above with respect to FIG. 2, the spring and damper modules enable the rack 100 relative displacement with the shock absorber apparatus 200A.

In FIG. 3B, air cushion and damper modules are assembled between the base (not shown), middle plate 230B, and the lower rack frame 260B. Coupled with the linear guides configuration described above with respect to FIG. 2, the air cushion and damper modules enable the rack 100 to be displaced relative to the shock absorber apparatus 200B. Referring momentarily to FIG. 6, the relative displacement of the rack 100 is shown. The rack 100 can move relative to the shock absorber apparatus 200 in the x and y-axis while restricting movement in the z-axis. These linear guides coupled with the spring and damper modules (of FIG. 3A) or the air cushion and damper modules (of FIG. 3B) absorb seismic energy resulting from an earthquake or other seismic activities.

Figure 4:
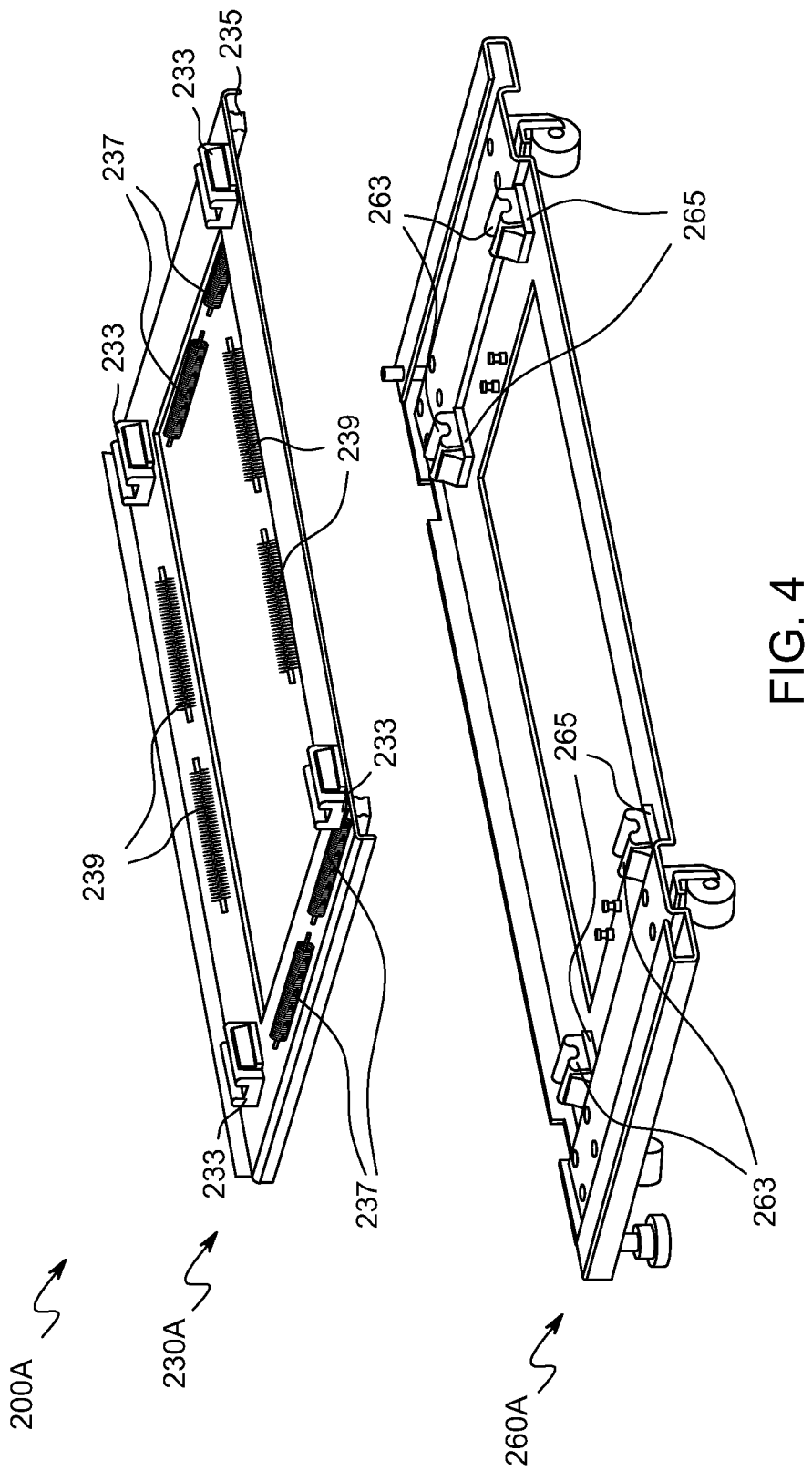
FIG. 4 illustrates the shock absorber apparatus 200A in greater detail.

FIG. 4 illustrates the shock absorber apparatus 200A in greater detail. The shock absorber apparatus 200A can include the middle plate 230A and the lower rack frame 260A. The middle plate 230A can include spring modules 237 for the x-axis and spring modules 239 for the y-axis. The lower rack frame 260A can include rubber dampers 265 for restricting movement in the z-axis.

Figure 9:
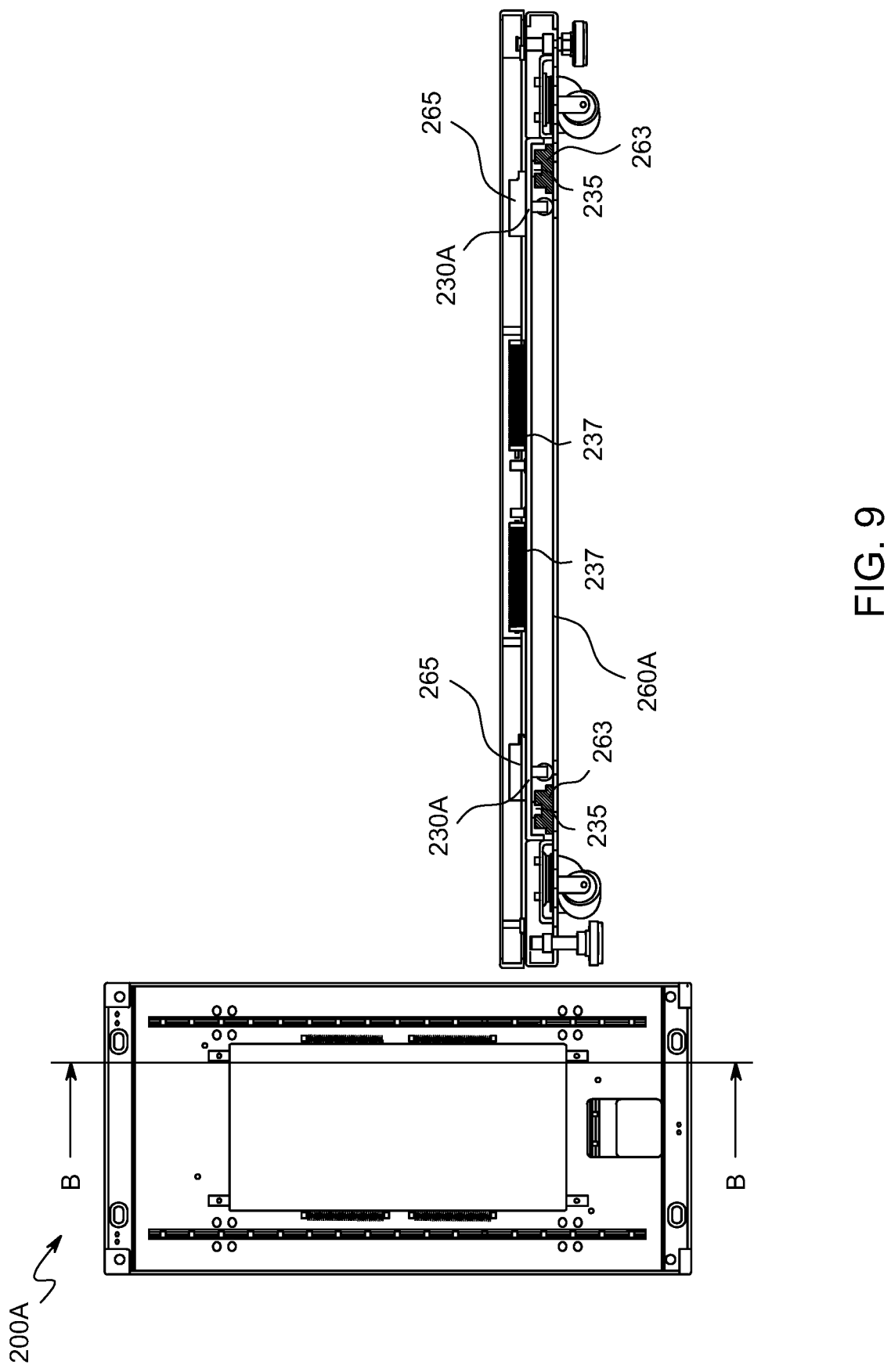
FIG. 9 illustrates a cross-section along section B-B of the shock absorber apparatus 200A of FIG. 3A.

Referring momentarily to FIG. 8, a cross-section along section A-A of the shock absorber apparatus 200A is provided. The rail assemblies 155 of the base 145 can be connected to the carriers 233 of the middle plate 230A. The rubber dampers 265 can be assembled between the base 145 and the middle plate 230A. Referring momentarily to FIG. 9, a cross-section along section B-B of the shock absorber apparatus 200A is provided. The rail assemblies 235 of the middle plate 230 can be connected to the carriers 263 of the lower rack frame 260A. The spring modules 237, 239 and the rubber dampers 265 assembled between the base 145, the middle plate 230A, and the lower rack frame 260A enable the rack (as shown in FIG. 2) to be displaced relative to the shock absorber apparatus 200A while absorbing seismic energy.

Figure 5:
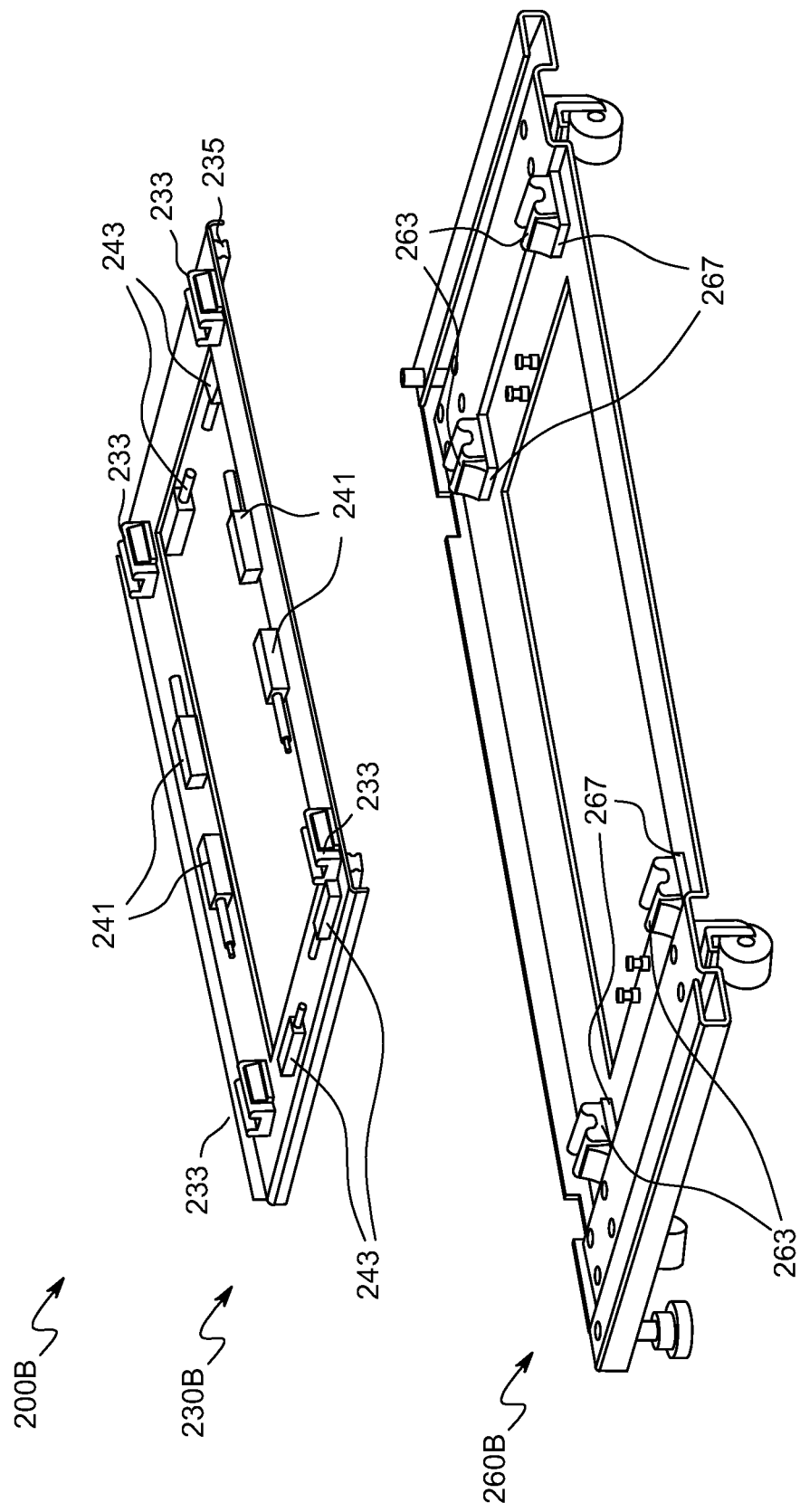
FIG. 5 illustrates the shock absorber apparatus 200B in greater detail.

FIG. 5 illustrates the shock absorber apparatus 200B in greater detail. The shock absorber apparatus 200B can include the middle plate 230B and the lower rack frame 260B. The middle plate 230B can include air cushion modules 241 for the y-axis and air cushion modules 243 for the x-axis. The lower rack frame 260B can include rubber dampers 267 for restricting movement in the z-axis. As indicated above with respect to FIG. 2, the rail assemblies of the base (both shown in FIG. 2) can be connected to the carriers 233 of the middle plate 230B. Furthermore, the rail assemblies 235 of the middle plate 230 can be connected to the carriers 263 of the lower rack frame 260B. The air cushion modules 241, 243 and the rubber dampers 267 assembled between the rack (shown in FIG. 2), the middle plate 230B, and the lower rack frame 260B enable the rack (shown in FIG. 2) to be displaced relative to the shock absorber apparatus 200B while absorbing seismic energy.

The shock absorber apparatus 200 can alleviate the impact associated with an earthquake by providing an oscillator for a rack 100 within a multitude of racks installed in a data center. Each rack 100 can be fitted with the disclosed shock absorber apparatus 200 to dampen the effects of an earthquake or other seismic activity. In order to be fully effective, the shock absorber apparatus 200 must be secured to a solid surface, i.e., a floor or ground.

FIG. 6 illustrates the relative displacement of the rack 100 with respect to the shock absorber apparatus 200. The relative displacement of the rack 100 is shown. The rack 100 can move relative to the shock absorber apparatus 200 in the x and y-axis while restricting movement in the z-axis. The linear guides (of FIG. 2) coupled with the spring and damper modules (of FIG. 3A) or the air cushion and damper modules (of FIG. 3B) absorb seismic energy resulting from an earthquake or other seismic activities.

FIG. 7A illustrates a levering feet device 280 in a first position installed on the shock absorber apparatus 200 (of FIG. 2). The levering feet device 280 can include a connecting assembly 282, a stop feature 284, and a contact feature 200. The lower rack frame 260 can include an aperture (not shown) configured to receive the connecting assembly 282 of the levering feet device 280. The aperture (not shown) can be configured with the same circumference to enable the connecting assembly 282 of the levering feet device 280 to slide with little to no tolerance. The stop feature 284 can have a larger circumference than the aperture (not shown) of the lower rack frame 260 to prevent the levering feet device 280 from advancing any further in the z-direction. Furthermore, the contact feature 286 of the levering feet device 280 can be made from a material that provides friction when moved across the surface of the floor. For example, the contact feature 286 of the levering feet device 280 can have a rubber outer surface such that contact with the floor prevents movement of the shock absorber apparatus 200. In comparison, the connecting assembly 282 and the stop feature 284 can be made from more rigid materials. The connecting assembly 282, the stop feature 284 and its components can be made of sheet metal using conventional metal fabrication techniques such as bending, forming, and stamping. As a result, the connecting assembly 282 and the stop feature 284 can be made inexpensively. Alternatively, the middle plate 230 and its components can be made of aluminum alloy, steel alloy, or any combination thereof.

FIG. 7B illustrates a levering feet device 280 in a second position installed on the shock absorber apparatus 200 of FIG. 2. When the levering feet device 280 is in the second position, the levering feet device 280 is positioned such that the contact feature 286 does not make contact with the floor. Specifically, the levering feet device 280 does not anchor the shock absorber apparatus 200 and the rack 100 to the floor or ground. This allows an operator to move the rack 100 and the shock absorber apparatus 200 freely across a surface without resistance from the levering feet device 280.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The terminology used herein is for the purpose of describing particular embodiments only and is not intended to limit the invention. As used herein, the singular forms "a", "an", and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising".

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A shock absorber apparatus comprising:
   an upper rack frame configured to secure a bottom frame of a rack server, the upper rack frame comprising a first plurality of rail assemblies;
   a middle plate comprising a second plurality of rail assemblies and a first plurality of carriers corresponding with the first plurality of rail assemblies of the upper rack frame, wherein the first plurality of rail assemblies is configured to restrict movement of the first plurality of carriers to a first axis; and
   a lower rack frame comprising a second plurality of carriers corresponding with the second plurality of rail assemblies of the middle plate, wherein the second plurality of rail assemblies is configured to restrict movement of the second plurality of carriers to a second axis, and wherein the middle plate comprises a first plurality of spring modules for the first axis and a second plurality of spring modules for the second axis.

2. The shock absorber apparatus of claim 1, wherein the lower rack frame comprising a plurality of dampers preventing movement of the rack server in a third axis.

3. The shock absorber apparatus of claim 1, wherein the middle plate comprising a first plurality of air cushion modules for the first axis and a second plurality of air cushion modules for the second axis.

4. The shock absorber apparatus of claim 3, wherein the lower rack frame comprising a plurality of dampers preventing movement of the rack server in a third axis.

5. The shock absorber apparatus of claim 1, further comprising a levering feet device configured to secure the shock absorber apparatus to a floor surface.

6. The shock absorber apparatus of claim 5, wherein the levering feet device comprising a contact feature, that comprises an outer surface material such that when in contact with the floor surface, prevents movement of the shock absorber apparatus.

7. The shock absorber apparatus of claim 6, wherein the levering feet device is retractable from the lower rack frame of the shock absorber apparatus.

8. A rack comprising:
   a top frame and a bottom frame, connected by at least one vertical post;
   a shock absorber apparatus located at the bottom frame, wherein the shock absorber apparatus comprising:
   an upper rack frame configured to secure the bottom frame of the rack, the upper rack frame comprising a first plurality of rail assemblies;
   a middle plate comprising a second plurality of rail assemblies and a first plurality of carriers corresponding with the first plurality of rail assemblies of the upper rack frame, wherein the first plurality of rail assemblies is configured to restrict movement of the first plurality of carriers to a first axis; and a lower rack frame comprising a second plurality of carriers corresponding with the second plurality of rail assemblies of the middle plate, wherein the second plurality of rail assemblies is configured to restrict movement of the second plurality of carriers to a second axis and wherein the middle plate further comprises a first plurality spring modules for the first axis and a second plurality of spring modules for the second axis.

9. The rack of claim 8, wherein the lower rack frame comprising a plurality of dampers preventing movement of the rack server in a third axis.

10. The rack of claim 8, wherein the middle plate comprising a first plurality of air cushion module for the first axis and a second plurality of air cushion module for the second axis.

11. The rack of claim 10, wherein the lower rack frame comprising a plurality of dampers preventing movement of the rack server in a third axis.

12. The rack of claim 8, further comprising a levering feet device configured to secure the shock absorber apparatus to a floor surface.

13. The rack of claim 12, wherein the levering feet device comprising a contact feature that comprises an outer surface material such that when in contact with the floor surface, prevents movement of the shock absorber apparatus.

14. The rack of claim 13, wherein the levering feet device is retractable from the lower rack frame of the shock absorber apparatus.

* * * * *